US011193976B2

(12) United States Patent
Vuorinen et al.

(10) Patent No.: US 11,193,976 B2
(45) Date of Patent: Dec. 7, 2021

(54) SWITCHING DEVICE WHOSE STATIONARY CONTACT IS PROVIDED WITH TEST TERMINAL

(71) Applicant: ABB Schweiz AG, Baden (CH)

(72) Inventors: Anu-Riikka Vuorinen, Vaasa (FI); Patrik Rabb, Vaasa (FI); Rainer Kolmonen, Vaasa (FI); Timo Jokiniemi, Vaasa (FI)

(73) Assignee: ABB Schweiz AG, Baden (CH)

( * ) Notice: Subject to any disclaimer, the term of this patent is extended or adjusted under 35 U.S.C. 154(b) by 0 days.

(21) Appl. No.: 16/820,129

(22) Filed: Mar. 16, 2020

(65) Prior Publication Data

US 2020/0217892 A1 Jul. 9, 2020

Related U.S. Application Data

(63) Continuation of application No. PCT/FI2018/050663, filed on Sep. 13, 2018.

(30) Foreign Application Priority Data

Sep. 15, 2017 (FI) .................................. U20174212

(51) Int. Cl.
    *G01R 31/327* (2006.01)
    *G01R 19/00* (2006.01)
    (Continued)

(52) U.S. Cl.
    CPC ....... *G01R 31/327* (2013.01); *G01R 19/0084* (2013.01); *H01H 1/5866* (2013.01); *H01H 45/14* (2013.01)

(58) Field of Classification Search
    CPC ...... G01R 31/00; G01R 31/327; G01R 19/00; G01R 19/0084; G01R 19/0092;
    (Continued)

(56) References Cited

U.S. PATENT DOCUMENTS 4,584,545 A     4/1986   Nagel
5,497,289 A *   3/1996   Sugishima ............ H02M 7/003
                                                                318/558

(Continued)

FOREIGN PATENT DOCUMENTS

CN           2583687 Y     10/2003
CN           1331178 C      8/2007
(Continued)

OTHER PUBLICATIONS

Finnish Patent Office, International Search Report & Written Opinion issued in corresponding Application No. PCT/FI2018/050663, dated Feb. 13, 2019 33 pp.

(Continued)

*Primary Examiner* — Hoai-An D. Nguyen
(74) *Attorney, Agent, or Firm* — Leydig, Voit & Mayer, Ltd.

(57) ABSTRACT

A switching device including: a body which has a first side wall and a first end wall, the first side wall being perpendicular in relation to a longitudinal direction, and the first end wall is substantially perpendicular to the first side wall; and a first fixed contact comprising an inner section and an outer section, the inner section having a thickness dimension, the outer section protrudes from the first side wall in the longitudinal direction. The first fixed contact includes a test terminal which is integral to the inner section and protrudes from the inner section in a lateral direction, which is perpendicular to the longitudinal direction and an end wall plane defined by the first end wall, the test terminal having a substantially planar test terminal surface, and the test terminal has a thickness dimension which is parallel to the thickness dimension of the inner section, the thickness dimension of the test terminal is substantially smaller than the thickness dimension of the inner section, the test terminal is accessible from outside the body from the direction of (Continued)

the first end wall, and the test terminal is adapted to be connected to a female connector.

20 Claims, 4 Drawing Sheets

(51) Int. Cl.
*H01H 1/58* (2006.01)
*H01H 45/14* (2006.01)

(58) Field of Classification Search
CPC ... G01R 1/00; G01R 1/02; G01R 1/04; H01H 1/00; H01H 1/12; H01H 1/14; H01H 1/20; H01H 1/2041; H01H 1/58; H01H 1/5866; H01H 45/00; H01H 45/14; H01H 50/00; H01H 50/14
USPC .... 324/415, 416, 418, 419, 424; 361/1, 117, 361/131, 600, 601, 632, 641, 643, 826, 361/828, 837
See application file for complete search history.

(56) References Cited

U.S. PATENT DOCUMENTS

| | | | |
|---|---|---|---|
| 6,208,130 B1 | 3/2001 | Cochran et al. | |
| 6,429,659 B1 | 8/2002 | Marple et al. | |
| 6,534,991 B2* | 3/2003 | Marple | G01R 31/3278 324/424 |
| 7,586,321 B2* | 9/2009 | Hirakawa | G01R 1/06755 324/755.11 |
| RE45,439 E * | 3/2015 | Prandi | G01C 23/005 73/504.12 |
| 2002/0036575 A1* | 3/2002 | Choi | H03M 1/24 341/6 |
| 2005/0013077 A1 | 1/2005 | Gemme et al. | |
| 2005/0253607 A1* | 11/2005 | Kimoto | G01R 1/07314 324/754.01 |
| 2008/0174326 A1* | 7/2008 | Jeon | G01R 1/07342 324/754.07 |
| 2009/0109589 A1* | 4/2009 | Yoo | H02H 3/10 361/93.1 |
| 2010/0226053 A1 | 9/2010 | Kamor et al. | |
| 2016/0268076 A1* | 9/2016 | Urasaki | H02P 6/006 |
| 2016/0314921 A1* | 10/2016 | Aratani | H01H 50/443 |

FOREIGN PATENT DOCUMENTS

| | | |
|---|---|---|
| CN | 201063040 Y | 5/2008 |
| CN | 102683121 A | 9/2012 |
| CN | 102820164 A | 12/2012 |
| CN | 103181033 A | 6/2013 |
| CN | 103996918 A | 8/2014 |
| CN | 104137342 A | 11/2014 |
| CN | 204102735 U | 1/2015 |
| CN | 205449441 U | 8/2016 |
| DE | 1110275 B | 7/1961 |
| DE | 3542349 A1 | 6/1987 |
| DE | 202010017964 U1 | 5/2013 |
| GB | 2465831 A | 6/2010 |
| GB | 2483632 A | 3/2012 |
| WO | 2004023506 A1 | 3/2004 |
| WO | 2014170528 A1 | 10/2014 |

OTHER PUBLICATIONS

European Patent Office, Extended Search Report issued in corresponding Application No. 18856195.5, dated May 27, 2021, 8 pp.
Chinese National Intellectual Property Administration, Office Action in Chinese Patent Application No. 201880059766.3, 14 pp. (dated Aug. 3, 2021).

* cited by examiner

SWITCHING DEVICE WHOSE STATIONARY CONTACT IS PROVIDED WITH TEST TERMINAL

BACKGROUND OF THE INVENTION

The invention relates to carrying out a voltage measurement from a fixed contact of a switching device having a high nominal current.

Measuring a voltage from the fixed contact of a switching device is known in the field. In a known assembly, a cable for voltage measurement is connected to the fixed contact of the switching device with a terminal lug so that the connection comprises a screw and a nut.

A problem with the switching device assembly described in the above is the inconvenient joining of the voltage measurement cable to the fixed contact of the switching device.

BRIEF DESCRIPTION OF THE INVENTION

It is an object of the invention to develop a switching device that allows the above-mentioned problem to be solved. The object of the invention is achieved with a switching device, characterised by what is stated in the independent claim. Preferred embodiments of the invention are disclosed in the dependent claims.

The invention is based on providing a test terminal on the fixed contact of the switching device, which test terminal is integral to the fixed contact, substantially thinner than the fixed contact, adapted to be connected to a female connector, and accessible from outside of the switching device body in a direction that is perpendicular to the fixed contact.

An advantage of the switching device according to the invention is that the voltage measurement cable may be easily connected to the integral test terminal of the fixed contact without installation accessories, such as screws and nuts. It is enough that the female connector of the voltmeter is connected to the test terminal. In addition, integrating the test terminal on the fixed contact of the switching device does not much complicate the manufacturing process of the fixed contact, because the fixed contact may still be manufactured from a copper rail, for example, whereby the test terminal may be formed by pressing and punching, for example. Because the test terminal is integral to the fixed contact of the switching device, there is no separate connection between them, such as a rivet, solder joint, or welding joint, the forming of which would complicate the manufacturing process of the switching device.

BRIEF DESCRIPTION OF THE FIGURES

The invention will now be described in more detail in connection with preferred embodiments and with reference to the accompanying drawings, in which.

DETAILED DESCRIPTION OF THE INVENTION

Figure 1:
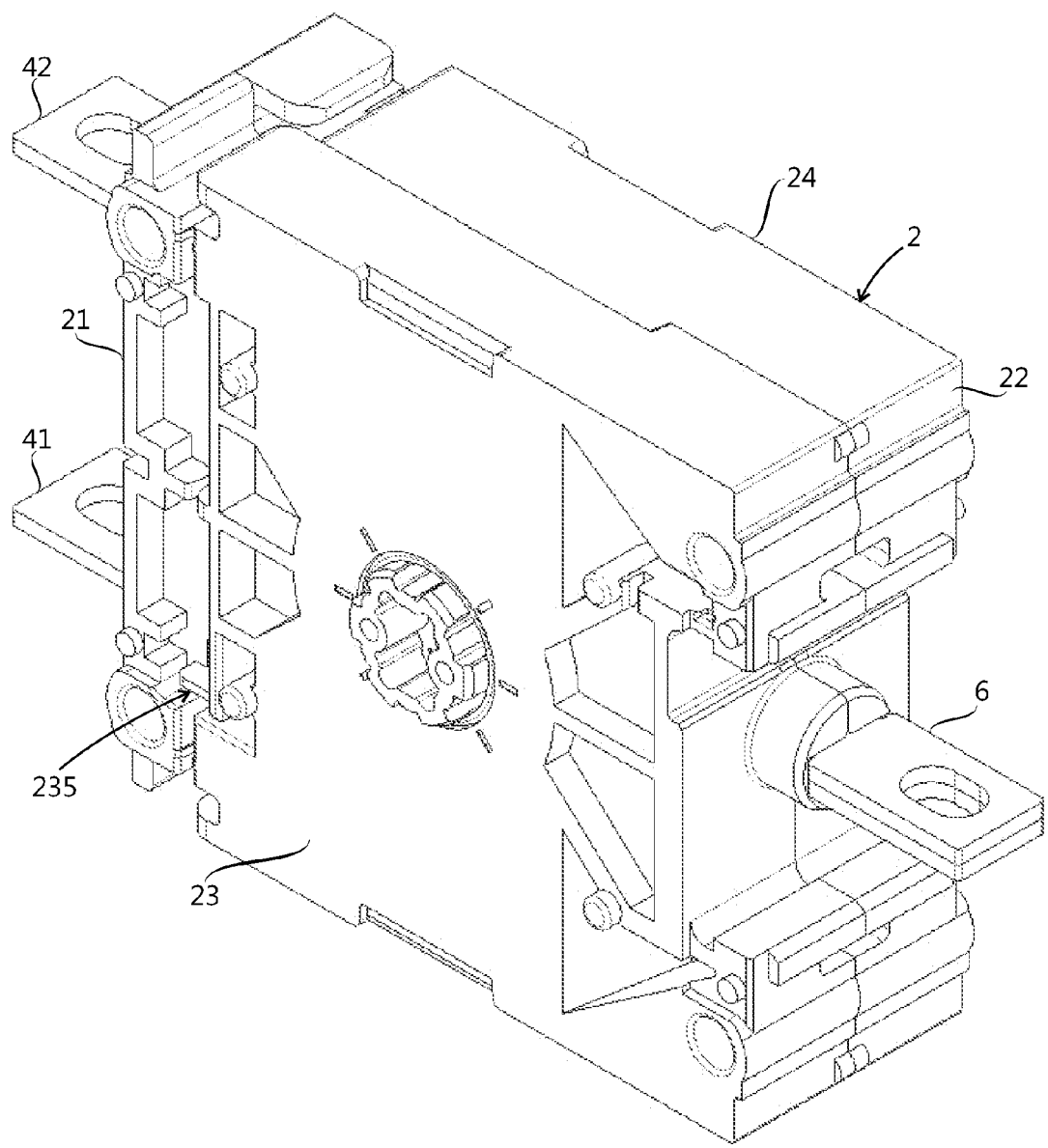
FIG. 1 shows a switching device according to an embodiment of the invention.

FIG. 1 shows a switching device according to an embodiment of the invention as an axonometric projection. The switching device comprises a body 2, a first fixed contact 41, a second fixed contact 42, a load contact 6, and a movable contact member, the latter remaining invisible in FIG. 1 inside the body. The first fixed contact 41 and the second fixed contact 42 extend from inside the body 2 to outside the body 2.

The body 2 has a first side wall 21, a second side wall 22, a first end wall 23, and a second end wall 24. The first side wall 21 and the second side wall 22 are substantially parallel and located at a distance from each other, as examined in a longitudinal direction. The first side wall 21 and the second side wall 22 are perpendicular to the longitudinal direction. The first end wall 23 is perpendicular to the first side wall 21. The second end wall 24 is substantially parallel to the first end wall 23 and located at a distance from it.

Figure 2:
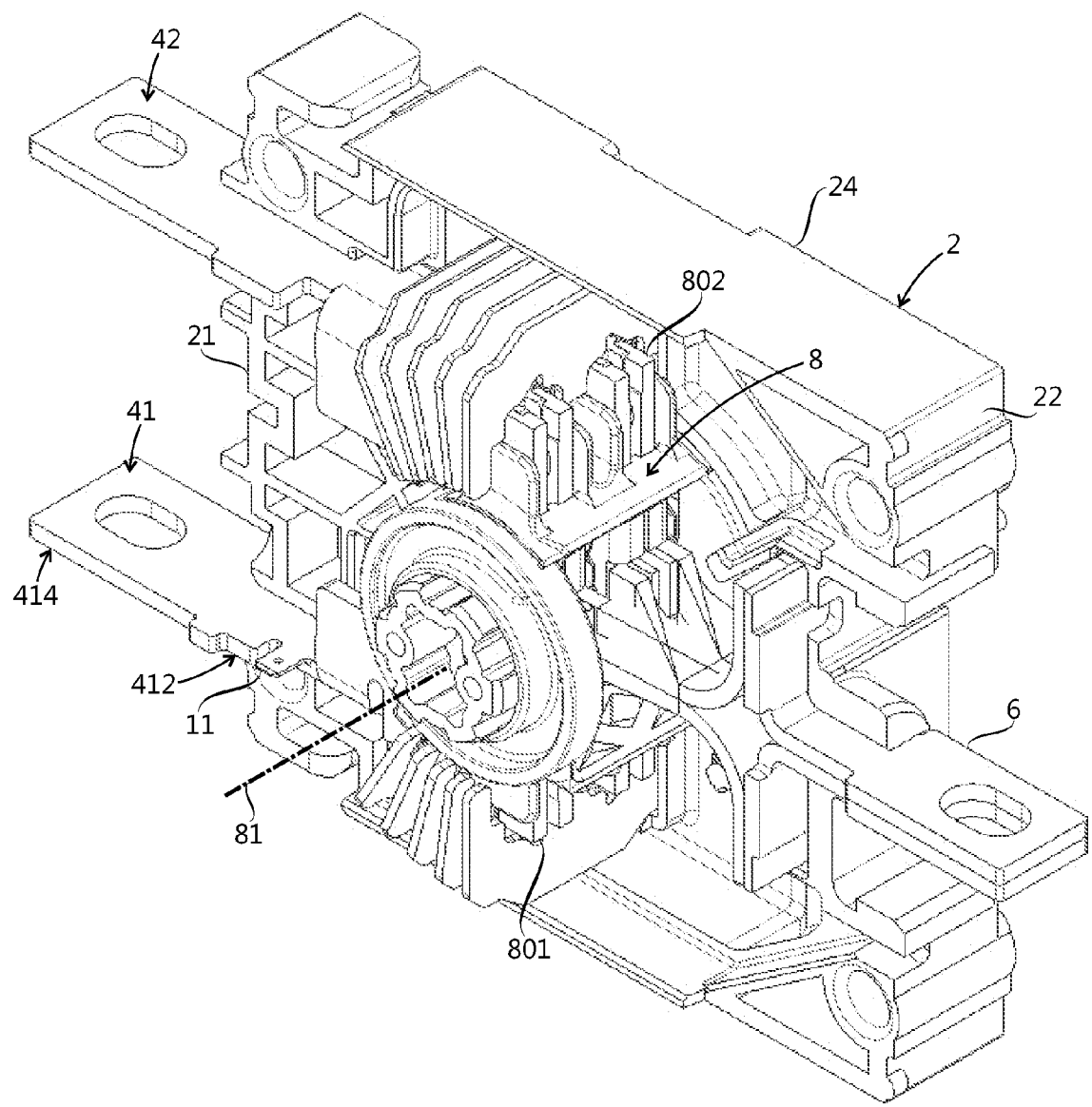
FIG. 2 shows the switching device of FIG. 1 partly disassembled.

In FIG. 2, half of the body 2 of the switching device is removed for a better view of the inner parts of the switching device. As seen in FIG. 2, the first fixed contact 41 comprises an inner section 412 and an outer section 414, out of which the inner section 412 is located inside the body 2 and the outer section 414 outside the body 2. Correspondingly, the second fixed contact 42 comprises an inner section and an outer section, out of which the inner section is located inside the body 2 and the outer section outside the body 2. The outer sections of the first fixed contact 41 and the second fixed contact 42 protrude out of the first side wall 21 in the longitudinal direction, and the load contact 6 protrudes out of the secand side wall 22 in the longitudinal direction. The second fixed contact 42 is identical to the first fixed contact 41. The switching device is adapted to be connected to a first power supply by the outer section 414, to a second power supply by the outer section of the second fixed contact 42, and to a load by the load contact 6.

The movable contact member 8 is adapted to pivot in relation to the body 2 around a pivot axis 81 between a first position and a second position. The pivot axis 81 is perpendicular to the end wall plane and the longitudinal direction.

The movable contact member 8 has a first movable contact 801 and a second movable contact 802. The first movable contact 801 and second movable contact 802 are blade contacts. In the first position of the movable contact member 8, the first movable contact 801 is in an electrically conductive contact with the first fixed contact 41, whereby the movable contact member 8 connects the first fixed contact 41 in an electrically conductive manner to the load contact 6. In the second position of the movable contact member 8, the second movable contact 802 is in an electrically conductive contact with the second fixed contact 42, whereby the movable contact member 8 connects the second fixed contact 42 in an electrically conductive manner to the load contact 6.

Figure 3:
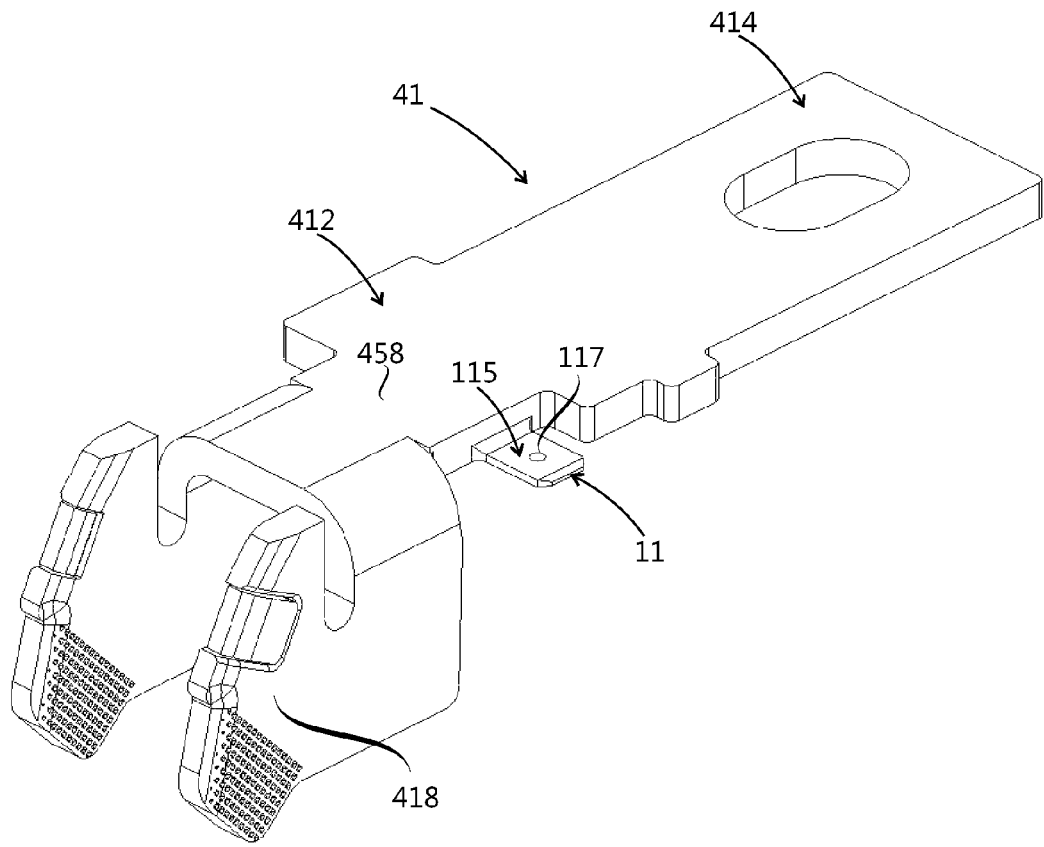
FIG. 3 shows a first fixed contact of the switching device of FIG. 1 as an axonometric projection.
Figure 4:
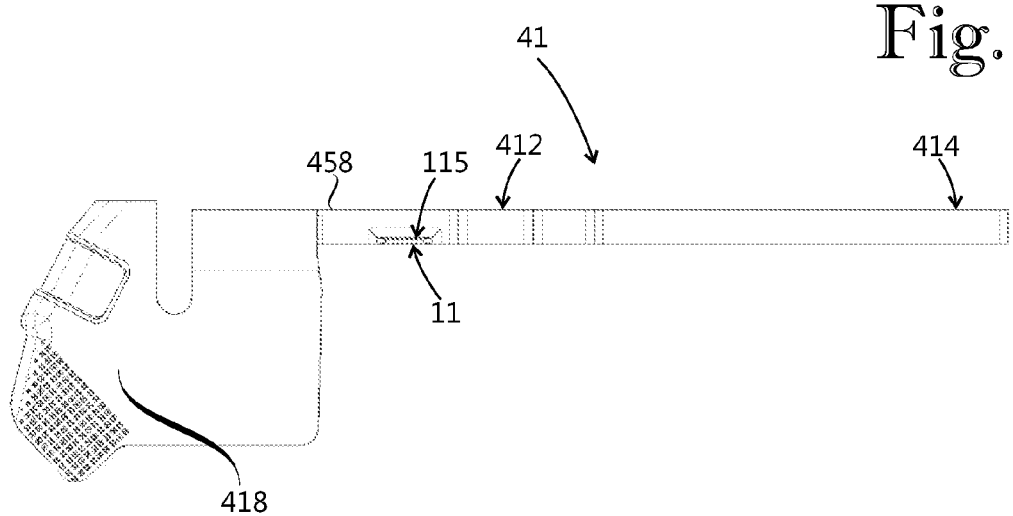
FIG. 4 is a side view of the first fixed contact of FIG. 3.
Figure 5:
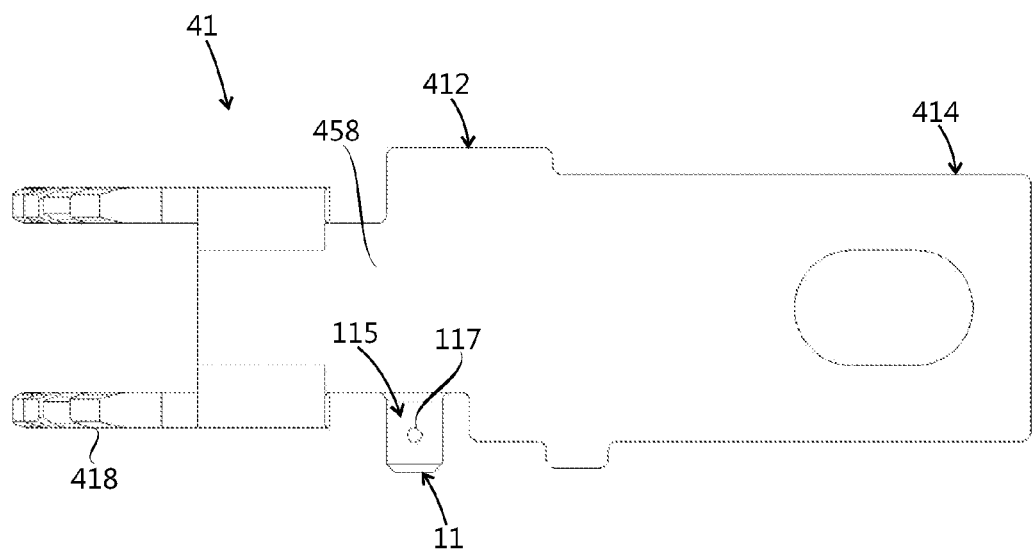
FIG. 5 is a top view of the first fixed contact of FIG. 3.
Figure 6:
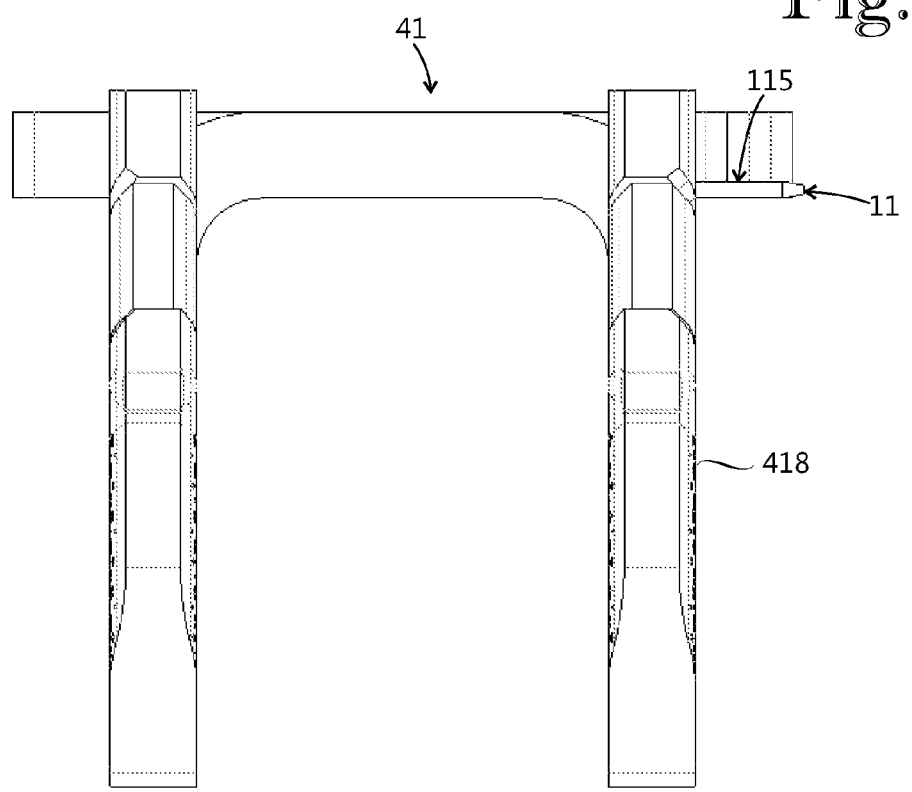
FIG. 6 is a front view of the first fixed contact of FIG. 3.

FIGS. 3 to 6 show the first fixed contact 41 of the switching device of FIG. 1 from different directions. FIG. 3 is an axonometric projection, and FIGS. 4, 5, and 6 show the first fixed contact 41 from the side, top, and front, respectively. The longitudinal direction of the first fixed contact 41 is horizontal in FIGS. 4 and 5, and in FIG. 6 perpendicular to the plane of the figure. In the switching device of FIG. 1, the longitudinal direction of the first fixed contact 41 coincides with the longitudinal direction of the switching device.

The first fixed contact 41 comprises an inner section 412, outer section 414, and a test terminal 11. In the switching device of FIG. 1, the first fixed contact 41 extends from inside the body 2 to outside the body 2, the inner section 412 being located inside the body 2 and the outer section 414 outside the body 2.

The first fixed contact 41 is made of silver-plated copper sheet. The first fixed contact 41 is in its entirety an integral component, in other words it is built of one sheet preform and has no joints, such as solder joints or welding joints. In an alternative embodiment, the first fixed contact is made of another material having good conductivity.

The test terminal 11 is adapted to be connected to a female connector. The test terminal 11 is accessible from outside the body 2, from the direction of the first end wall 23, through a test terminal opening 235. The test terminal opening 235 is formed in the end wall 23 and adapted to allow connecting the female connector (not shown) on the cable of a voltmeter to the test terminal 11. Accessibility of the test terminal 11 in this context thus refers to the fact that the female connector of the voltmeter cable may be plugged to the test terminal 11 from the direction of the end wall 23 without the need to disassemble the body 2. As the female connector is being connected to the test terminal 11, the female connector is moved in substantially the direction which is perpendicular to the end wall plane.

The switching device of FIG. 1 may be used in the setting up of such a switching device assembly which comprises the switching device in question and a voltmeter conductively connected to the first fixed contact 41 of the switching device with the aid of connecting means. The connecting means comprise an electric cable which has, at its end on the switching device side, a female connector, and the test terminal 11 is received in said female connector. The figures do not show the voltmeter or connecting means.

In an embodiment, the switching device assembly comprises the switching device according to the invention, and an actuation unit adapted to control the switching device automatically. The actuation unit contains electronics. The actuation unit is conductively connected to the test terminal of the first fixed contact of the switching device by means of a measuring cable. The electronics of the actuation unit is adapted to measure the voltage on the first fixed contact of the switching device on the basis of voltage information obtained from the test terminal of the first fixed contact. In other words, the electronics of the actuation unit comprises a voltmeter.

As shown in FIG. 2, the second fixed contact 42 is placed in the body 2 in a different position than the first fixed contact 41. In relation to the first fixed contact 41, the second fixed contact has been rotated by 180° around the longitudinal direction. This being the case, the test terminal of the second fixed contact 42 extends in an opposite direction to the test terminal 11 of the first fixed contact 41 so that the test terminal of the second fixed contact 42 is accessible from outside the body 2, from the direction of the second end wall 24. Because the test terminals of the first fixed contact 41 and the second fixed contact 42 are located on different sides of the body 2, the respective measuring cables may be installed to run along different routes at a distance from each other. Setting the measuring cables like this increases the reliability of the assembly, because the likelihood of measuring cables, possibly at different potentials, touching each other is decreased.

The inner section 412 of the first fixed contact 41 has a substantially planar inner section surface 458, and a substantially planar mating surface 418. The inner section 412 has a thickness dimension which is substantially perpendicular to the inner section surface 458 and the longitudinal direction. The thickness dimension of the inner section 412 is a dimension defined at the inner section surface 458. In FIGS. 4 and 6, the thickness dimension is vertical. In the switching device of FIG. 1, the thickness dimension of the inner section 412 is substantially parallel to the end wall plane defined by the first end wall 23.

The substantially planar mating surface 418 is perpendicular to the substantially planar inner section surface 458, and the normal of the mating surface 418 is parallel to the lateral direction. The substantially planar mating surface 418 is adapted to be in an electrically conductive connection with the first movable contact 801 when the movable contact member 8 is in its first position. Because the first movable contact 801 is a blade contact, it is, in the first position of the movable contact member 8, overlapping with the mating surface 418 of the first fixed contact 41. In other words, when the movable contact member 8 is in its first position, the switching device is adapted to conduct current between the movable contact 801 and the mating surface 418 in a direction substantially perpendicular to the plane of the mating surface 418.

The test terminal 11 is integral to the inner section 412. The test terminal 11 is located between the mating surface 418 and the outer section 414 of the first fixed contact, as seen in the longitudinal direction. The test terminal 11 protrudes from the inner section 412 in the lateral direction, which is perpendicular to the longitudinal direction and the end wall plane. The test terminal 11 has a substantially planar test terminal surface 115, which is parallel to the inner section surface 458 of the fixed contact 41. The test terminal 11 has a thickness dimension which is parallel to the thickness dimension of the inner section 412. The thickness dimension of the test terminal 11 is less than one fourth of the thickness dimension of the inner section 412. In an alternative embodiment, the thickness dimension of the test terminal is substantially smaller than the thickness dimension of the inner section, such as less than one half of it.

The ratio of the thickness dimension of the test terminal and the thickness dimension of the inner section of the first fixed contact depends on, for example, the nominal current of the switching device, and the type of the female connector to which the test terminal is adapted to be connected. The main rule is that a switching device having a higher nominal current has a larger cross sectional area in the inner section of its first fixed contact than on a switching device having a smaller nominal current. A larger cross sectional area also often means a larger thickness dimension.

As seen in FIGS. 3 and 5, the test terminal 11 has a retaining opening 117, extending in the direction of the thickness dimension, and adapted to cooperate with a retaining protrusion formed on the female connector, and thus to ensure that the test terminal 11 and the female connector stay in an electrically conductive contact. The retaining opening 117 is a round through-hole. In an alternative embodiment, the retaining opening may be a closed hole and/or its cross section may differ from a round shape. The retaining opening may also be left out in, for example, an embodiment where the test terminal is adapted to be connected to a female connector that has no retaining protrusion.

The cross section of the test terminal 11 is substantially rectangular so that the longitudinal dimension of the cross section is more than five times the thickness dimension. The test terminal 11 is adapted to be connected to an Abiko flat receptacle. In an alternative embodiment, the longitudinal dimension of the cross section of the test terminal is at least twice the thickness dimension, and the test terminal is adapted to be connected to another commonly used female connector.

FIG. 1 shows that the free end of the test terminal 11 is located, as examined laterally, more inward than the outer surface of the first end wall 23. Therefore, the body 2 protects the test terminal 11 against mechanical damage in connection with transporting and installing the switching device.

As seen in FIG. 5, less than one fourth of the test terminal 11 protrudes laterally more outward than the other parts of the first fixed contact 41. The lateral direction of the first fixed contact 41 is in FIG. 5 parallel to the vertical direction. The minor protrusion in the lateral direction protects the test terminal 11 during the manufacturing process of the first fixed contact 41, such as during silver-plating.

The switching device shown in FIG. 1 is a throw-over switch. In an alternative embodiment of the invention, the switching device is a double-pole switching device comprising a body, a first fixed contact and a load contact. In an embodiment, the first fixed contact and the load contact of the double-pole switching device are identical.

It will be apparent to a person skilled in the art that the basic idea of the invention may be implemented in many different ways. The invention and its embodiments are thus not restricted to the above-described examples but may vary within the scope of the claims.

The invention claimed is:

1. A switching device that comprises:
a body which has a first side wall and a first end wall, the first side wall being perpendicular in relation to a longitudinal direction, and the first end wall is perpendicular to the first side wall;
a first fixed contact made of a material of good electrical conductivity, and comprising an inner section and an outer section, the first fixed contact extending from inside the body to outside the body, the inner section is located inside the body and the outer section is located outside the body, the inner section having a planar inner section surface, the inner section having a thickness dimension which is a dimension defined at the inner section surface, and is perpendicular to the inner section surface and the longitudinal direction, and parallel to an end wall plane defined by the first end wall, the outer section protruding from the first side wall in the longitudinal direction, and the switching device being adapted to be connected to a power supply by the outer section,
wherein the first fixed contact comprises a test terminal which is integral to inner section and protrudes from the inner section in a lateral direction, which is perpendicular to the longitudinal direction and the end wall plane, the test terminal having a planar test terminal surface, and the test terminal has a thickness dimension which is parallel to the thickness dimension of the inner section, the thickness dimension of the test terminal is smaller than the thickness dimension of the inner section, the test terminal is accessible from outside the body from the direction of the first end wall, and the test terminal is adapted to be connected to a female connector.

2. The switching device as claimed in claim 1, wherein the switching device has a movable contact member which has a first movable contact, and is adapted to pivot in relation to the body around a pivot axis between a first position and a second position, the pivot axis is perpendicular to the end wall plane, in the first position the first movable contact is in an electrically conductive connection with the first fixed contact, and in the second position the first movable contact is electrically isolated from the first fixed contact.

3. The switching device as claimed in claim 2, wherein the first movable contact is a blade contact, and the first fixed contact comprises a planar mating surface which is, in the first position of the first movable contact, adapted to be in an electrically conductive contact with the first movable contact, and the normal of the mating surface is parallel to the lateral direction.

4. The switching device as claimed in claim 1, wherein the test terminal has a retaining opening, extending the direction of the thickness dimension, and adapted to cooperate with a retaining protrusion formed on the female connector, and thus to ensure that the test terminal and the female connector stay in an electrically conductive contact.

5. The switching device as claimed in claim 1, wherein the cross section of the test terminal is rectangular so that the longitudinal dimension of the cross section is at least twice the thickness dimension.

6. The switching device as claimed in claim 1, wherein the free end of the test terminal is located, as examined laterally, more inward than the outer surface of the first end wall.

7. The switching device as claimed in claim 1, wherein the test terminal is adapted to be connected to a commonly used female connector.

8. The switching device as claimed in claim 1, wherein the thickness dimension of the test terminal is less than one half of the thickness dimension of the inner section.

9. The switching device as claimed in claim 1, wherein the switching device comprises a second fixed contact which comprises an inner section and an outer section and is identical to the first fixed contact, the second fixed contact extending from inside the body to outside the body, the inner section of the second fixed contact is located inside the body and the outer section is located outside the body, the test terminal of the second fixed contact extending in the opposite direction to the test terminal of the first fixed contact so that the test terminal of the second fixed contact is accessible from outside the body from the direction of the second end wall of the body, the second end wall being parallel to the first end wall and is located at a distance from it.

10. A switching device assembly, comprising a switching device and a voltmeter electrically conductively connected to the first fixed contact of the switching device with the aid of connecting means, wherein the switching device is a switching device as claimed in claim 1, and the connecting means comprise a female connector, and the test terminal is received in the female connector.

11. The switching device as claimed in claim 3, wherein the test terminal has a retaining opening, extending in the direction of the thickness dimension, and adapted to cooperate with a retaining protrusion formed on the female connector, and thus to ensure that the test terminal and the female connector stay in an electrically conductive contact.

12. The switching device as claimed in claim 11, wherein the cross section of the test terminal is rectangular so that the longitudinal dimension of the cross section is at least twice the thickness dimension.

13. The switching device as claimed in claim 12, wherein the free end of the test terminal is located, as examined laterally, more inward than the outer surface of the first end wall.

14. The switching device as claimed in claim 13, wherein the test terminal is adapted to be connected to a commonly used female connector.

15. The switching device as claimed in claim 2, wherein the test terminal has a retaining opening, extending in the direction of the thickness dimension, and adapted to cooperate with a retaining protrusion formed on the female connector, and thus to ensure that the test terminal and the female connector stay in an electrically conductive contact.

16. The switching device as claimed in claim 2, wherein the cross section of the test terminal is rectangular so that the longitudinal dimension of the cross section is at least twice the thickness dimension.

17. The switching device as claimed in claim 2, wherein the free end of the test terminal is located, as examined laterally, more inward than the outer surface of the first end wall.

18. The switching device as claimed in claim 2, wherein the test terminal is adapted to be connected to a commonly used female connector.

19. The switching device as claimed in claim 2, wherein the thickness dimension of the test terminal is less than one half of the thickness dimension of the inner section.

20. The switching device as claimed in claim 14, wherein the switching device comprises a second fixed contact which comprises an inner section and an outer section and is identical to the first fixed contact, the second fixed contact extending from inside the body to outside the body, the inner section of the second fixed contact is located inside the body and the outer section is located outside the body, the test terminal of the second fixed contact extending in the opposite direction to the test terminal of the first fixed contact so that the test terminal of the second fixed contact is accessible from outside the body from the direction of the second end wall of the body, the second end wall being parallel to the first end wall and is located at a distance from it.

\* \* \* \* \*